(12) United States Patent
Davis et al.

(10) Patent No.: US 8,579,636 B2
(45) Date of Patent: Nov. 12, 2013

(54) MIDPLANE ORTHOGONAL CONNECTOR SYSTEM

(75) Inventors: Wayne Samuel Davis, Harrisburg, PA (US); Robert Neil Whiteman, Jr., Middletown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 13/370,053

(22) Filed: Feb. 9, 2012

(65) Prior Publication Data

US 2013/0210246 A1   Aug. 15, 2013

(51) Int. Cl.
    *H01R 12/00* (2006.01)
(52) U.S. Cl.
    USPC .......................................................... 439/65
(58) Field of Classification Search
    USPC .......... 439/544, 676, 65, 701, 607.03, 607.05
    See application file for complete search history.

(56) References Cited

U.S. PATENT DOCUMENTS

| | | | | |
|---|---|---|---|---|
| 2,204,408 | A * | 6/1940 | Folsom | 439/857 |
| 5,664,968 | A * | 9/1997 | Mickievicz | 439/607.1 |
| 6,287,158 | B1 * | 9/2001 | Brammer | 439/874 |
| 6,764,349 | B2 * | 7/2004 | Provencher et al. | 439/701 |
| 6,899,566 | B2 * | 5/2005 | Kline et al. | 439/607.56 |
| 7,621,781 | B2 * | 11/2009 | Rothermel et al. | 439/607.05 |
| 7,666,009 | B2 * | 2/2010 | Minich et al. | 439/101 |
| 7,758,385 | B2 | 7/2010 | Davis et al. | |
| 7,775,802 | B2 * | 8/2010 | Defibaugh et al. | 439/65 |
| 7,811,128 | B2 * | 10/2010 | Pan | 439/607.05 |
| 7,988,491 | B2 * | 8/2011 | Davis et al. | 439/607.27 |
| 8,016,616 | B2 * | 9/2011 | Glover et al. | 439/607.05 |
| 8,157,591 | B2 * | 4/2012 | Fedder et al. | 439/607.07 |
| 8,157,595 | B2 * | 4/2012 | Saraswat et al. | 439/620.09 |
| 8,267,721 | B2 * | 9/2012 | Minich | 439/607.05 |
| 2006/0024983 | A1 | 2/2006 | Cohen et al. | |
| 2008/0045079 | A1 * | 2/2008 | Minich et al. | 439/544 |
| 2008/0233806 | A1 * | 9/2008 | Rothermel et al. | 439/676 |
| 2010/0055933 | A1 | 3/2010 | Laurx et al. | |
| 2010/0151726 | A1 | 6/2010 | Fedder et al. | |

OTHER PUBLICATIONS

International Search Report, International Application No. PCT/US2013/0022095, International Filing Date Jan. 18, 2013.

* cited by examiner

*Primary Examiner* — Alexander Gilman

(57) ABSTRACT

A receptacle assembly for a midplane connector system has a receptacle housing having openings receiving signal contacts and ground shields of a header assembly. The receptacle assembly includes contact modules coupled to the receptacle housing that each have a leadframe, a dielectric frame and a ground shield. The leadframe has signal contacts arranged in pairs carrying differential signals that are generally arranged along a leadframe plane with mating portions at ends thereof that have at least two points of contact electrically connected to a corresponding signal contact of the header assembly. The dielectric frame holds the signal contacts. The ground shield is coupled to a side of the dielectric frame and has ground tabs extending into the dielectric frame to provide electrical shielding between the pairs of signal contacts and grounding beams electrically connected to ground shields of the header assembly.

20 Claims, 9 Drawing Sheets

MIDPLANE ORTHOGONAL CONNECTOR SYSTEM

BACKGROUND OF THE INVENTION

The subject matter herein relates generally to electrical connectors for use in a midplane connector system.

Some electrical systems, such as network switches and computer servers with switching capability, include receptacle connectors that are oriented orthogonally on opposite sides of a midplane in a cross-connect application. Switch cards may be connected on one side of the midplane and line cards may be connected on the other side of the midplane. The line card and switch card are joined through header connectors that are mounted on opposite sides of the midplane board. Typically, traces are provided on the sides and/or the layers of the midplane board to route the signals between the header connectors. Sometimes the line card and switch card are joined through header connectors that are mounted on the midplane in an orthogonal relation to one another. The connectors include patterns of signal and ground contacts that extend through a pattern of vias in the midplane.

However, conventional orthogonal connectors have experienced certain limitations. For example, it is desirable to increase the density of the signal and ground contacts within the connectors. Heretofore, the contact density has been limited in orthogonal connectors, due to the contact and via patterns. Conventional contact and via patterns of an orthogonal connection are formed symmetric about a forty-five degree axis with respect to columns or rows of the contacts. The symmetric arrangement limits the density of the signal and ground contacts in conventional orthogonal connectors. For example, in differential applications where signal contacts are arranged in a plurality of differential pairs, a distance, sometimes referred to as a pitch, between adjacent signal pairs has been determined based on a space needed for each differential pair and an associated ground(s). In conventional connectors, the pitch is a square grid such that the row to row pitch is the same as the column to column pitch in order to use the same connector design on each side of the midplane, which may be desirable to reduce a cost and/or a complexity of the orthogonal connector system.

A need remains for an improved orthogonal connector system that increases contact and via density in differential pair applications.

BRIEF DESCRIPTION OF THE INVENTION

In one embodiment, a midplane connector system is provided including a midplane assembly, a first connector assembly and a second connector assembly. The midplane assembly having a midplane circuit board having a first side and a second side. The midplane assembly having a first header assembly mounted to and extending from the first side of the midplane circuit board and a second header assembly mounted to and extending from the second side of the midplane circuit board. The midplane assembly having a plurality of signal paths each comprising a signal contact of the first header assembly, a conductive via through the midplane circuit board and a signal contact of the second header assembly. The signal contacts of the first and second header assemblies are received in the same via. The first connector assembly has a first circuit board and a first receptacle assembly coupled to the first circuit board. The first receptacle assembly is coupled to the first header assembly. The first receptacle assembly has contact modules having receptacle signal contacts arranged in pairs parallel to the first circuit board. The receptacle signal contacts of the first connector assembly are coupled to corresponding signal contacts of the first header assembly. The second connector assembly has a second circuit board and a second receptacle assembly coupled to the second circuit board. The second receptacle assembly is coupled to the second header assembly. The second receptacle assembly has contact modules having receptacle signal contacts arranged in pairs perpendicular to the second circuit board. The receptacle signal contacts of the second connector assembly are coupled to corresponding signal contacts of the second header assembly.

In another embodiment, a receptacle assembly is provided having a receptacle housing having signal contact openings and ground shield openings receiving signal contacts of a header assembly and ground shields of the header assembly, respectively. The receptacle assembly includes contact modules coupled to the receptacle housing that each have a leadframe, a dielectric frame and a ground shield. The leadframe has signal contacts arranged in pairs carrying differential signals that are generally arranged along a leadframe plane with mating portions at ends thereof that have at least two points of contact configured to be electrically connected to a corresponding signal contact of the header assembly. The dielectric frame holds the signal contacts. The ground shield is coupled to a side of the dielectric frame and has ground tabs extending into the dielectric frame to provide electrical shielding between the pairs of signal contacts and grounding beams electrically connected to ground shields of the header assembly.

In another embodiment, a contact module for a receptacle assembly is provided that includes a leadframe having signal contacts arranged in pairs carrying differential signals. The signal contacts are generally arranged along a leadframe plane. The signal contacts have mating portions at ends thereof that have at least two points of contact. A dielectric frame holds the signal contacts. The dielectric frame is dielectric and includes opposite first and second sides generally parallel to the leadframe plane. A ground shield is coupled to the first side of the dielectric frame and has ground tabs extending into the dielectric frame. The ground tabs provide electrical shielding between the pairs of signal contacts.

DETAILED DESCRIPTION OF THE INVENTION

Figure 1:
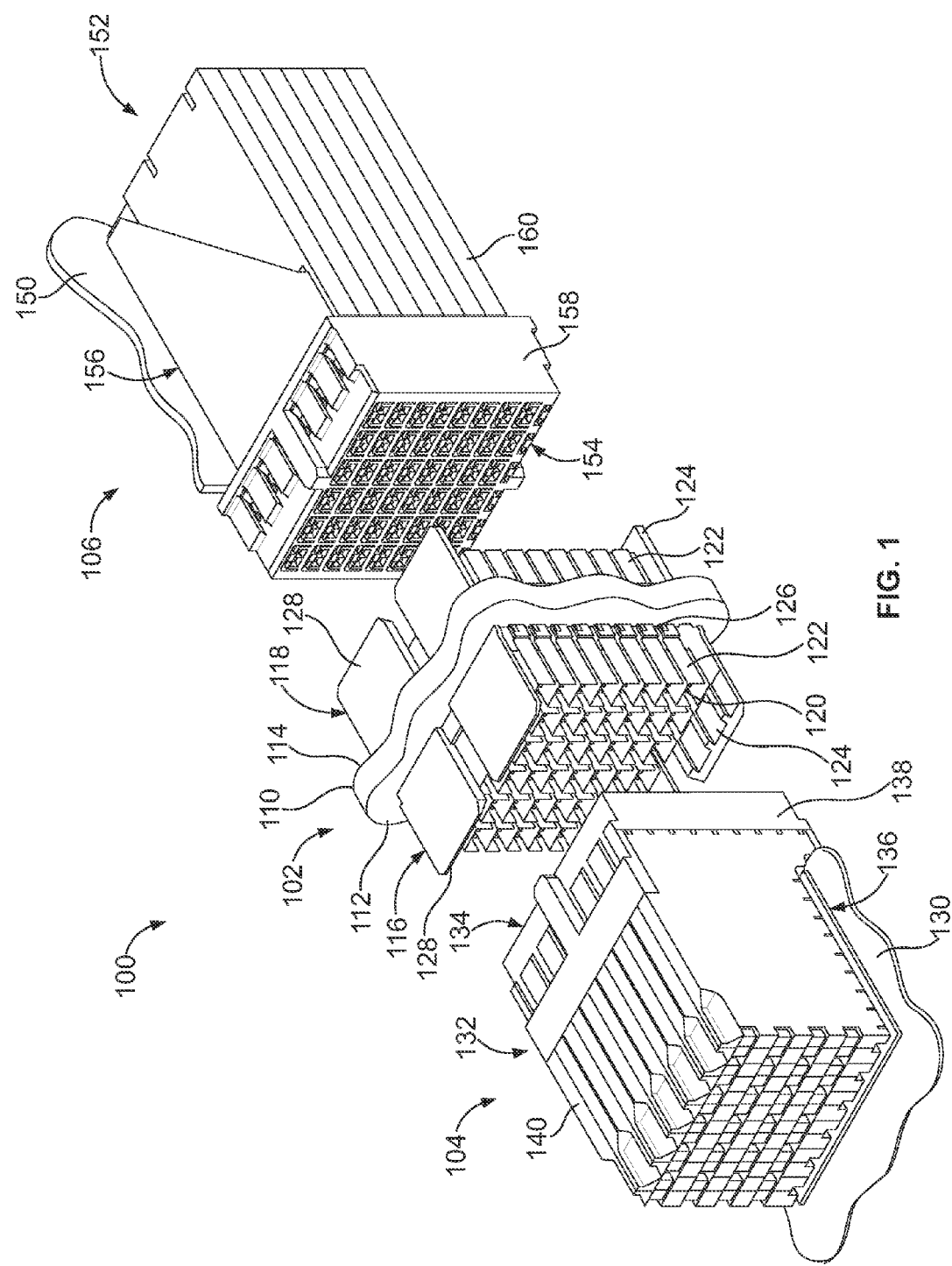
FIG. 1 is a perspective view of a midplane connector system formed in accordance with an exemplary embodiment.

FIG. 1 is a perspective view of a midplane connector system 100 formed in accordance with an exemplary embodiment. The midplane connector system 100 includes a midplane assembly 102, a first connector assembly 104 configured to be coupled to one side of the midplane assembly 102 and a second connector assembly 106 configured to be connected to a second side the midplane assembly 102. The midplane assembly 102 is used to electrically connect the first and second connector assemblies 104, 106. Optionally, the first connector assembly 104 may be part of a daughter card and the second connector assembly 106 may be part of a backplane, or vice versa. The first and second connector assemblies 104, 106 may be line cards or switch cards.

The midplane assembly 102 includes a midplane circuit board 110 having a first side 112 and second side 114. The midplane assembly 102 includes a first header assembly 116 mounted to and extending from the first side 112 of the midplane circuit board 110. The midplane assembly 102 includes a second header assembly 118 mounted to and extending from the second side 114 of the midplane circuit board 110. The first and second header assemblies 116, 118 each include header signal contacts 120 electrically connected to one another through the midplane circuit board 110.

The midplane assembly 102 includes a plurality of signal paths therethrough defined by the header signal contacts 120 and conductive vias that extend through the midplane circuit board 110. The header signal contacts 120 of the first and second header assembly 116, 118 are received in the same conductive via to define a signal path through the midplane assembly 102. In an exemplary embodiment, the signal paths pass straight through the midplane assembly 102 along linear paths.

In an exemplary embodiment, the first and second header assemblies 116, 118 may be identical to one another. The first and second header assemblies 116, 118 may have an identical pinout allowing the first and second header assemblies 116, 118 to be mounted to the midplane circuit board 110 using conductive vias that pass straight through the midplane circuit board 110 between the first side 112 and the second side 114. The first and second header assemblies 116, 118 are not rotated 90° relative to one another as is typically of conventional connector systems, and thus do not suffer from a loss in density or a loss in performance as is typical of such connector systems.

The first and second header assemblies 116, 118 include header ground shields 122 that provide electrical shielding around corresponding header signal contacts 120. In an exemplary embodiment, the header signal contacts 120 are arranged in pairs configured to convey differential signals. The header ground shields 122 peripherally surround a corresponding pair of the header signal contacts 120. In an exemplary embodiment, the header ground shields 122 are C-shaped, covering three sides of the pair of header signal contacts 120. One side of the header ground shield 122 is open. In the illustrated embodiment, the header ground shields 122 have an open bottom, but the header ground shield 122 below the open bottom provides shielding across the open bottom. Each pair of header signal contacts 120 is therefore surrounded on all four side thereof using the C-shaped header ground shield 122 and the header ground shield 122 below the pair of header signal contacts 120.

The first and second header assemblies 116, 118 each include a header housing 124 used to hold the header signal contacts 120 and the header ground shields 122. The header housing 124 is manufactured from a dielectric material, such as a plastic material. The header housing 124 includes a base 126 configured to be mounted to the midplane circuit board 110. The header housing 124 includes shroud walls 128 extending from the base 126. The shroud walls 128 cover portions of the header signal contacts 120 and header ground shields 122. The connector assemblies 104, 106 are coupled to the shroud walls 128. The shroud walls 128 may guide the connector assemblies 104, 106 during mating with the header assemblies 116, 118 respectively.

The first connector assembly 104 includes a first circuit board 130 and a first receptacle assembly 132 coupled to the first circuit board 130. The first receptacle assembly 132 is configured to be coupled to the first header assembly 116. The first receptacle assembly 132 has a header interface 134 configured to be mated with the first header assembly 116. The first receptacle assembly 132 has a board interface 136 configured to be mated with the first circuit board 130. In an exemplary embodiment, the board interface 136 is orientated perpendicular with respect to the header interface 134. When the first receptacle assembly 132 is coupled to the first header assembly 116, the first circuit board 130 is orientated perpendicular with respect to the midplane circuit board 110.

The first receptacle assembly 132 includes a front housing 138 used to hold a plurality of contact modules 140. The contact modules 140 are held in a stacked configuration generally parallel to one another. The contact modules 140 hold a plurality of receptacle signal contacts 142 (shown in FIG. 3) that are electrically connected to the first circuit board 130 and define signal paths through the first receptacle assembly 132. The receptacle signal contacts 142 are configured to be electrically connected to the header signal contacts 120 of the first header assembly 116. In an exemplary embodiment, the contact modules 140 provide electrical shielding for the receptacle signal contacts 142. Optionally, the receptacle signal contacts 142 may be arranged in pairs carrying differential signals. In an exemplary embodiment, the contact modules 140 generally provide 360° shielding for each pair of receptacle signal contacts 142 along substantially the entire length of the receptacle signal contacts 142 between the board interface 136 and the header interface 134. The shield structure of the contact modules 140 that provides the electrical shielding for the pairs of receptacle signal contacts 142 is electrically connected to the header ground shields 122 of the first header assembly 116 and is electrically connected to a ground plane of the first circuit board 130.

The second connector assembly 106 includes a second circuit board 150 and a second receptacle assembly 152 coupled to the second circuit board 150. The second receptacle assembly 152 is configured to be coupled to the second header assembly 118. The second receptacle assembly 152 has a header interface 154 configured to be mated with the second header assembly 118. The second receptacle assembly 152 has a board interface 156 configured to be mated with the second circuit board 150. In an exemplary embodiment, the board interface 156 is orientated perpendicular with respect to the header interface 154. When the second receptacle assembly 152 is coupled to the second header assembly 118, the second circuit board 150 is orientated perpendicular with respect to the midplane circuit board 110. The second circuit board 150 is oriented perpendicular to the first circuit board 130.

The second receptacle assembly 152 includes a front housing 158 used to hold a plurality of contact modules 160. The contact modules 160 are held in a stacked configuration generally parallel to one another. The contact modules 160 hold a plurality of receptacle signal contacts 162 (shown in FIG. 4) that are electrically connected to the second circuit board 150 and define signal paths through the second receptacle assembly 152. The receptacle signal contacts 162 are configured to be electrically connected to the header signal contacts 120 of the second header assembly 118. In an exemplary embodiment, the contact modules 160 provide electrical shielding for the receptacle signal contacts 162. Optionally, the receptacle signal contacts 162 may be arranged in pairs carrying differential signals. In an exemplary embodiment, the contact modules 160 generally provide 360° shielding for each pair of receptacle signal contacts 162 along substantially the entire length of the receptacle signal contacts 162 between the board interface 156 and the header interface 154. The shield structure of the contact modules 160 that provides the electrical shielding for the pairs of receptacle signal contacts 162 is electrically connected to the header ground shields 122 of the second header assembly 118 and is electrically connected to a ground plane of the second circuit board 150.

In the illustrated embodiment, the first circuit board 130 is oriented generally horizontally. The contact modules 140 of the first receptacle assembly 132 are orientated generally vertically. The second circuit board 150 is oriented generally vertically. The contact modules 160 of the second receptacle assembly 152 are oriented generally horizontally. The first connector assembly 104 and the second connector assembly 106 have an orthogonal orientation with respect to one another.

Figure 2:
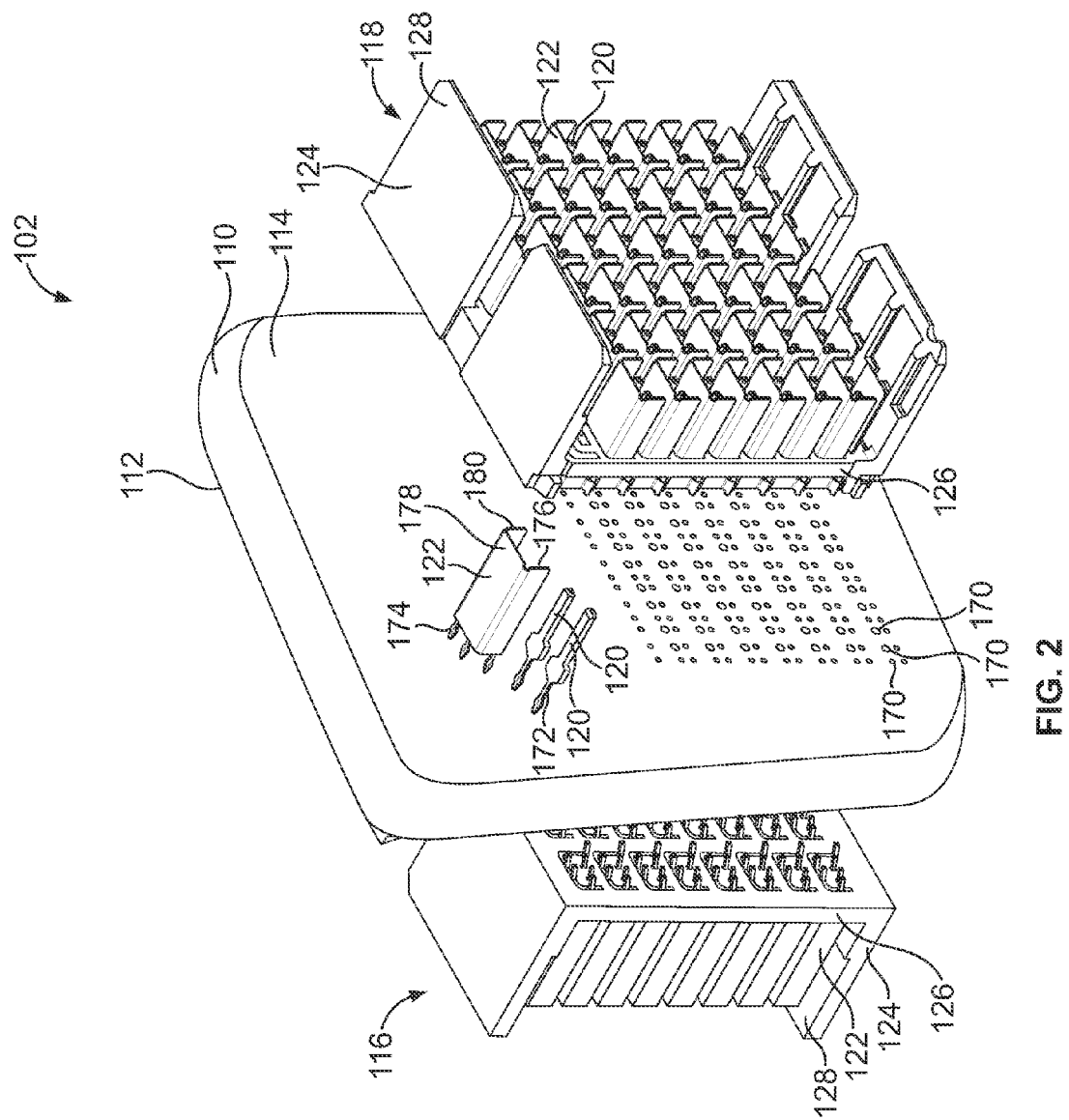
FIG. 2 is an exploded view of a midplane assembly showing first and second header assemblies poised for mounting to a midplane circuit board.

FIG. 2 is an exploded view of the midplane assembly 102 showing the first and second header assemblies 116, 118 poised for mounting to the midplane circuit board 110. A plurality of conductive vias 170 extend through the midplane circuit board 110 between the first and second sides 112, 114. The vias 170 extend straight through the midplane circuit board 110. No traces are needed routed along the board interconnecting vias on one side of the midplane circuit board 110 with vias on the other side of the midplane circuit board 110 as is typically with conventional midplane circuit boards that have the header assemblies rotated 90°. Having the vias 170 pass straight through and eliminating traces allows for better performance and reduces the cost of the midplane circuit board 110. The conductive vias 170 receive the header signal contacts 120 of the first and second header assemblies 116, 118. Some of the conductive vias 170 are configured to receive the header ground shields 122. The conductive vias 170 that receive the header ground shields 122 may surround the pair of conductive vias 170 that receive the corresponding pair of header signal contacts 120. The same conductive vias 170 receive header ground shields 122 of both header assemblies 116, 118 to directly connect such header ground shields 122. The same conductive vias 170 receive header signal contacts 120 of both header assemblies 116, 118 to directly connect such header signal contacts 120.

In an exemplary embodiment, the header signal contacts 120 include compliant pins 172 that are configured to be loaded into corresponding conductive vias 170. The compliant pins 172 are mechanically and electrically connected to the conductive vias 170. In an exemplary embodiment, the header ground shields 122 include compliant pins 174 that are configured to be received in corresponding conductive vias 170. The compliant pins 174 are mechanically and electrically connected to the conductive vias 170.

The header ground shields 122 are C-shaped and provide shielding on three sides of the pair of header signal contacts 120. The header ground shields 122 have a plurality of walls, such as three planar walls 176, 178, 180. The walls 176, 178, 180 may be integrally formed or alternatively, may be separate pieces. The compliant pins 174 extend from each of the walls 176, 178, 180 to electrically connect the walls 176, 178, 180 to the midplane circuit board 110. The wall 178 defines a center wall or top wall of the header ground shield 122. The walls 176, 180 define side walls that extend from the center wall 178. The side walls 176, 180 may be generally perpendicular with respect to the center wall 178. The bottom of each header ground shield 122 is open between the side walls 176, 180. The header ground shield 122 associated with another pair of header signal contacts 120 provides shielding along the open, fourth side thereof such that each of the pairs of header signal contacts 120 is shielded from each adjacent pair in the same column and the same row. For example, the top wall 178 of a first header ground shield 122 which is below a second header ground shield 122 provides shielding across the open bottom of the C-shaped second header shield 122.

Other configurations or shapes for the header ground shields 122 are possible in alternative embodiments. More or less walls may be provided in alternative embodiments. The walls may be bent or angled rather than being planar. In other alternative embodiments, the header ground shields 122 may provide shielding for individual header signal contacts 120 or sets of contacts having more than two header signal contacts 120.

Figure 3:
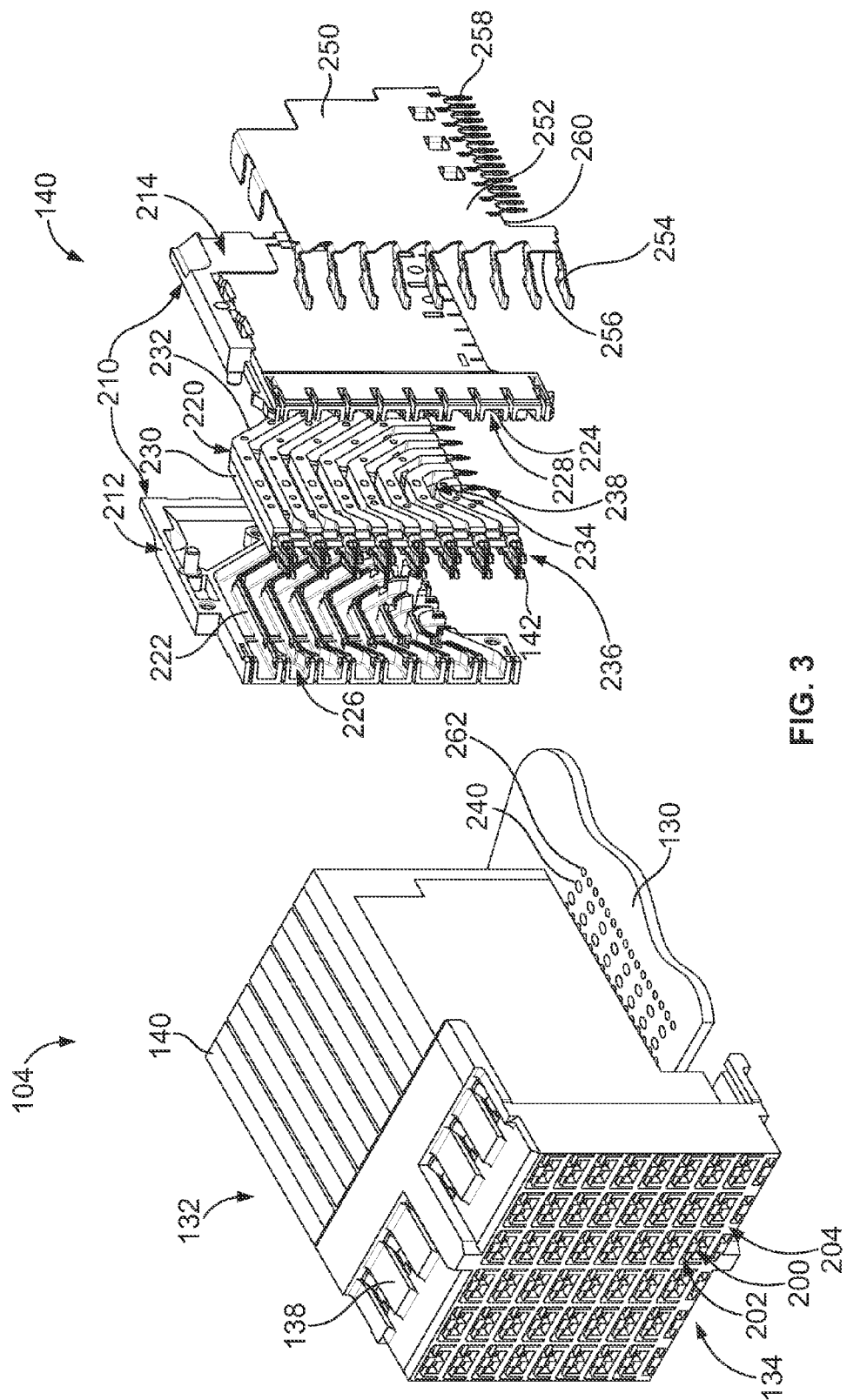
FIG. 3 is a front, exploded perspective view of a first receptacle assembly formed in accordance with an exemplary embodiment.

FIG. 3 is a front, exploded perspective view of the first receptacle assembly 132 formed in accordance with an exemplary embodiment. FIG. 3 illustrates one of the contact modules 140 in an exploded state and poised for assembly and loading into the front housing 138. The front housing 138 includes a plurality of signal contact openings 200 and a plurality of ground contacts openings 202 at a mating end 204 of the front housing 138. The mating end 204 defines the header interface 134 of the first receptacle assembly 132.

The contact modules 140 are coupled to the front housing 138 such that the receptacle signal contacts 142 are received in corresponding signal contact openings 200. Optionally, a single receptacle signal contact 142 is received in each signal contact opening 200. The signal contact openings 200 may also receive corresponding header signal contacts 120 (shown in FIG. 1) therein when the receptacle and header assemblies 132, 116 are mated. The ground contact openings 202 receive corresponding header ground shields 122 (shown in FIG. 1) therein when the receptacle and header assemblies 132, 116 are mated. The ground contact openings 202 receive grounding members, such as grounding beams of the contact modules 140 that mate with the header ground shields 122 to electrically common the receptacle and header assemblies 132, 116.

The front housing 138 is manufactured from a dielectric material, such as a plastic material, and provides isolation between the signal contact openings 200 and the ground contact openings 202. The front housing 138 isolates the receptacle signal contacts 142 and the header signal contacts 120 from the header ground shields 122. The front housing 138 isolates each set of receptacle and header signal contacts 142, 120 from other sets of receptacle and header signal contacts 142, 120.

The ground contact openings 202 are C-shaped in the illustrated embodiment to receive the C-shaped header ground shields 122. Other shapes are possible in alternative embodiments, such as when other shaped header ground shields 122 are used. The signal contact openings 200 are chamfered at the mating end 204 to guide the header signal contacts 120 into the signal contact openings 200 during mating.

The contact module 140 includes a conductive holder 210, which in the illustrated embodiment includes a first holder member 212 and a second holder member 214 that are coupled together to form the holder 210. The holder members 212, 214 are fabricated from a conductive material. For example, the holder members 212, 214 may be die cast from a metal material. Alternatively, the holder members 212, 214 may be stamped and formed or may be fabricated from a plastic material that has been metalized or coated with a metallic layer. By having the holder members 212, 214 fabricated from a conductive material, the holder members 212, 214 may provide electrical shielding for the first receptacle assembly 132. When the holder members 212, 214 are coupled together, the holder members 212, 214 define at least a portion of a shield structure to provide electrical shielding for the receptacle signal contacts 142.

The conductive holder 210 holds a frame assembly 220, which includes the receptacle signal contacts 142. The holder members 212, 214 provide shielding around the frame assembly 220 and receptacle signal contacts 142. The holder members 212, 214 include tabs 222, 224 that extend inward toward one another to define discrete channels 226, 228, respectively. The tabs 222, 224 define at least a portion of a shield structure that provides electrical shielding around the receptacle signal contacts 142. The tabs 222, 224 are configured to extend into the frame assembly 220 such that the tabs 222, 224 are positioned between receptacle signal contacts 142 to provide shielding between corresponding receptacle signal contacts 142.

The frame assembly 220 includes a pair of dielectric frames 230, 232 surrounding the receptacle signal contacts 142. In an exemplary embodiment, the receptacle signal contacts 142 are initially held together as leadframes (not shown), which are overmolded with dielectric material to form the dielectric frames 230, 232. Other manufacturing processes may be utilized to form the dielectric frames 230, 232 other than overmolding a leadframe, such as loading receptacle signal contacts 142 into a formed dielectric body. The dielectric frames 230, 232 include openings 234 that receive the tabs 222, 224. The openings 234 are located between adjacent receptacle signal contacts 142 such that when the tabs 222, 224 are loaded into the openings 234, the tabs 222, 224 are positioned between adjacent receptacle signal contacts 142 to provide shielding between such receptacle signal contacts 142.

The receptacle signal contacts 142 have mating portions 236 extending from the front walls of the dielectric frames 230, 232 and mounting portions 238 extending from the bottom walls of the dielectric frames 230, 232. Other configurations are possible in alternative embodiments. The mating portions 236 and mounting portions 238 are the portions of the receptacle signal contacts 142 that extend from the dielectric frames 230, 232. In an exemplary embodiment, the mating portions 236 extend generally perpendicular with respect to the mounting portions 238. Inner portions or encased portions of the receptacle signal contacts 142 transition between the mating portions 236 and the mounting portions 238 within the dielectric frames 230, 232. The mating portions 236 are configured to be mated with and electrically connected to corresponding header signal contacts 120 (shown in FIG. 1). The mounting portions 238 are configured to be electrically connected to the first circuit board 130. For example, the mounting portions 238 may include compliant pins that extend into conductive vias 240 in the first circuit board 130.

In an exemplary embodiment, the receptacle signal contacts 142 are arranged as differential pairs. In an exemplary embodiment, one of the receptacle signal contacts 142 of each pair is held by the dielectric frame 230 while the other receptacle signal contact 142 of the differential pair is held by the other dielectric frame 232. The receptacle signal contacts 142 of each pair extend through the frame assembly 220 generally along parallel paths such that the receptacle signal contacts 142 are skewless between the mating portions 236 and the mounting portions 238. Each contact module 140 holds both receptacle signal contacts 142 of each pair. The receptacle signal contacts 142 of the pairs are held in different columns.

Each contact module 140 has two columns of receptacle signal contacts 142. One column is defined by the receptacle signal contacts 142 held by the dielectric frame 230 and another column is defined by the receptacle signal contacts 142 held by the dielectric frame 232. The receptacle signal contacts 142 of each pair are arranged in a row extending generally perpendicular with respect to the columns.

The holder members 212, 214 provide electrical shielding between and around respective pairs of the receptacle signal contacts 142. The holder members 212, 214 provide shielding from electromagnetic interference (EMI) and/or radio frequency interference (RFI). The holder members 212, 214 may provide shielding from other types of interference as well. The holder members 212, 214 prevent crosstalk between different pairs of receptacle signal contacts 142. The holder members 212, 214 provide electrical shielding around the outside of the frames 230, 232, and thus around the outside of all of the receptacle signal contacts 142, as well as between the receptacle signal contacts 142, such as between pairs of receptacle signal contacts 142 using the tabs 222, 224. The holder members 212, 214 control electrical characteristics, such as impedance control, crosstalk control, and the like, of the receptacle signal contacts 142.

In an exemplary embodiment, the contact module 140 includes a ground shield 250 coupled to one side of the conductive holder 210. The ground shield 250 includes a main body 252 that is generally planar and extends alongside of the second holder member 214. The ground shield 250 includes grounding beams 254 extending from a front 256 of the main body 252. The grounding beams 254 are configured to extend into the ground contact openings 202. The grounding beams 254 are configured to engage and be electrically connected to the header ground shields 122 (shown in FIG. 1) when the contact modules 140 are loaded into the front housing 138 and when the first receptacle assembly 132 is coupled to the first header assembly 116. The grounding beams 254 may be deflectable. The grounding beams 254 are configured to be positioned between pairs of the receptacle signal contacts 142. For example, one grounding beam 254 is configured to be positioned above each pair of receptacle signal contacts 142 and another grounding beam 254 is configured to be positioned below each pair of receptacle signal contacts 142. The grounding beams 254 provide shielding along the mating portions 236 of the receptacle signal contacts 142. Optionally, other grounding beams may be provided along the sides of the mating portions 236 in addition to, or in the alternative to, the grounding beams 254 above and below the receptacle signal contacts 142.

The ground shield 250 includes ground pins 258 extending from a bottom 260 of the ground shield 250. The ground pins 258 may be compliant pins. The ground pins 258 are configured to be received in corresponding conductive vias 262 in the first circuit board 130. In the illustrated embodiment, the ground pins 258 are all arranged in a single column generally aligned with the main body 252. The ground pins 258 may be arranged in different locations in alternative embodiments. For example, at least some of the ground pins 258 may be bent inward into the conductive holder 210 such that the ground pins 258 are aligned with and positioned between the mounting portions 238 of corresponding receptacle signal contacts 142. In other embodiments, ground bars may be used that extend across all of the contact modules 140.

During assembly, the frame assembly 220 is loaded into the conductive holder 210. The first and second holder members 212, 214 are coupled together around the frame assembly 220. The ground shield 250 is coupled to the second holder member 214. The contact module 140 is then loaded into the rear of the front housing 138. Once all of the contact modules 140 are loaded into the front housing 138, the first receptacle assembly 132 may be mounted to the first circuit board 130 by loading the mounting portions 238 and the ground pins 258 into the conductive vias 240, 262, respectively.

Figure 4:
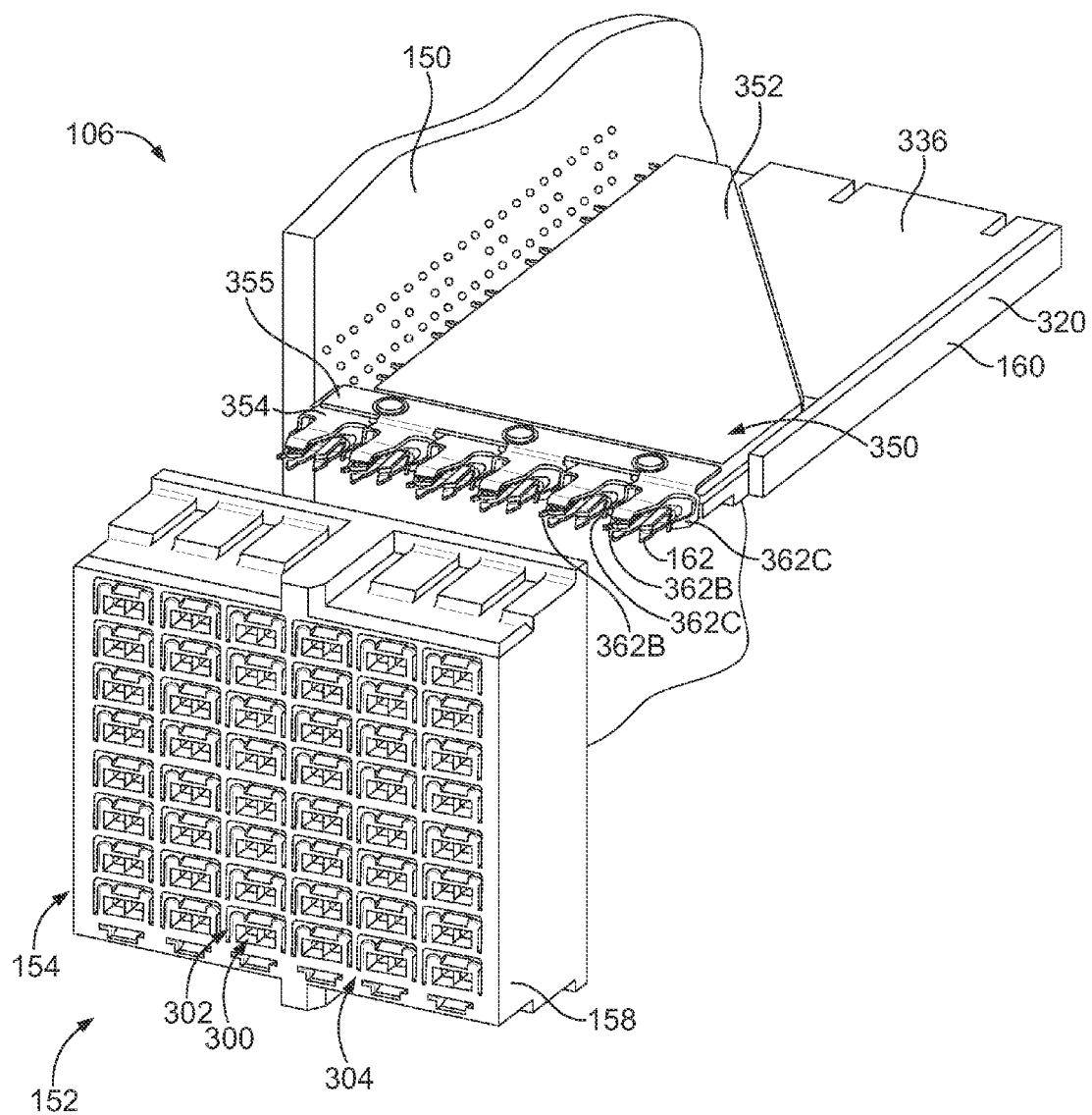
FIG. 4 is a front perspective view of a portion of a second receptacle assembly.

FIG. 4 is a front perspective view of a portion of the second receptacle assembly 152 showing one of the contact modules 160 poised for loading into the front housing 158. The front housing 158 includes a plurality of signal contact openings 300 and a plurality of ground contacts openings 302 at a mating end 304 of the front housing 158. The mating end 304 defines the header interface 154 of the first receptacle assembly 152.

The contact module 160 is coupled to the front housing 158 such that the receptacle signal contacts 162 are received in corresponding signal contact openings 300. Optionally, a single receptacle signal contact 162 is received in each signal contact opening 300. The signal contact openings 300 may also receive corresponding header signal contacts 120 (shown in FIG. 2) therein when the receptacle and header assemblies 152, 118 are mated. The ground contact openings 302 receive corresponding header ground shields 122 (shown in FIG. 2) therein when the receptacle and header assemblies 152, 118 are mated. The ground contact openings 302 receive grounding members, such as grounding beams of the contact modules 160 that mate with the header ground shields 122 to electrically common the receptacle and header assemblies 152, 118.

The front housing 158 is manufactured from a dielectric material, such as a plastic material, and provides isolation between the signal contact openings 300 and the ground contact openings 302. The front housing 158 isolates the receptacle signal contacts 162 and the header signal contacts 120 from the header ground shields 122. The front housing 158 isolates each set of receptacle and header signal contacts 162, 120 from other sets of receptacle and header signal contacts 162, 120.

The ground contact openings 302 are C-shaped in the illustrated embodiment to receive the C-shaped header ground shields 122. Other shapes are possible in alternative embodiments, such as when other shaped header ground shields 122 are used. The ground contact openings 302 are chamfered at the mating end 304 to guide the header ground shields 122 into the ground contact openings 302 during mating. The signal contact openings 300 are chamfered at the mating end 304 to guide the header signal contacts 120 into the signal contact openings 300 during mating.

Figure 5:
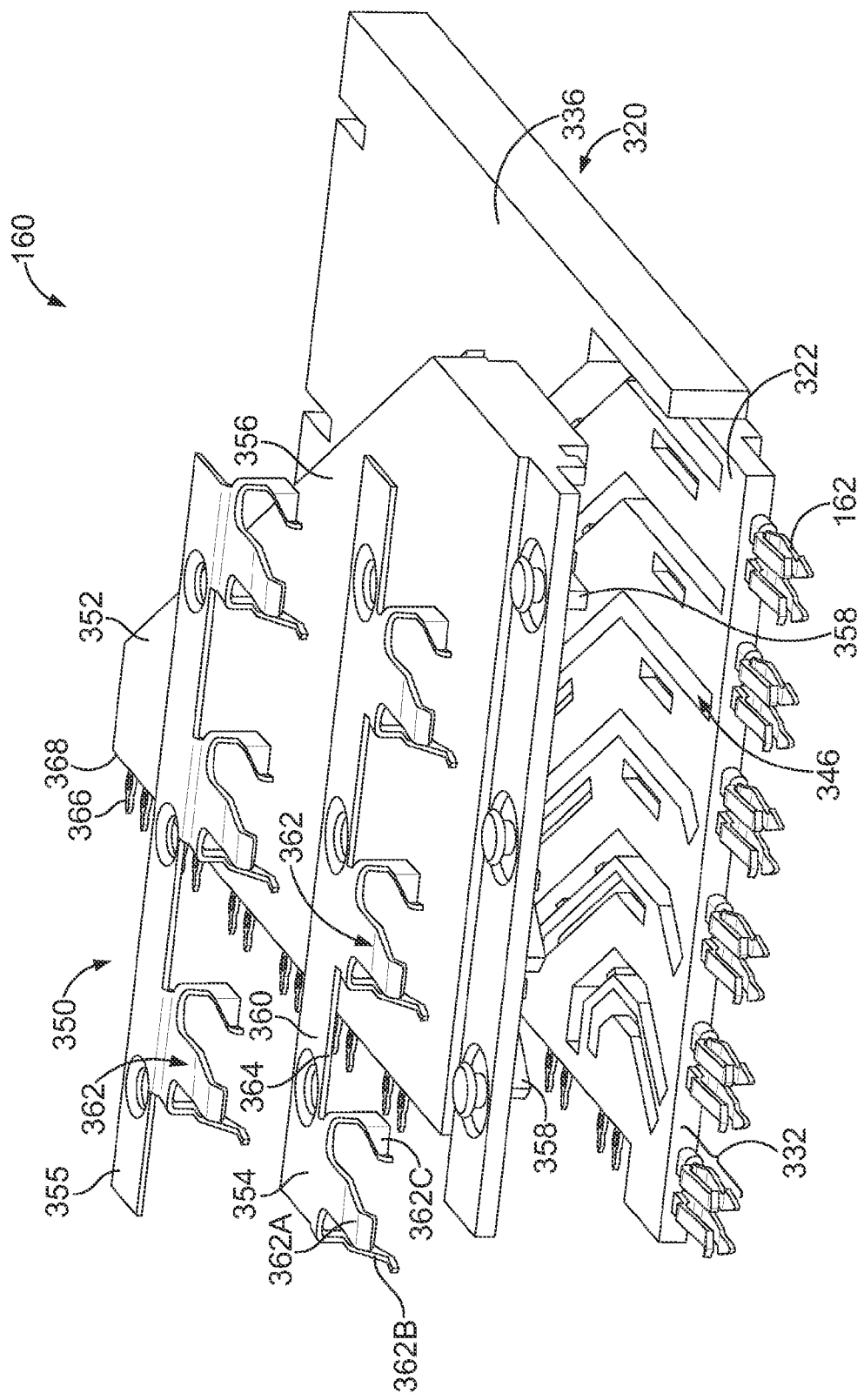
FIG. 5 is an exploded view of a contact module for the second receptacle assembly shown in FIG. 4.

FIG. 5 is an exploded view of the contact module 160. The contact module 160 includes a frame assembly 320, which includes the receptacle signal contacts 162. The receptacle signal contacts 162 are arranged in pairs carrying differential signals. In an exemplary embodiment, the frame assembly 320 includes a dielectric frame 322 that surrounds the receptacle signal contacts. Optionally, the dielectric frame 322 may be overmolded over the receptacle signal contacts 162. The receptacle signal contacts 162 may form part of a leadframe that is overmolded to encase the conductors defining the receptacle signal contacts 162. The various features of the contact module 160 are designed to provide a receptacle assembly 152 operable at frequencies, densities and/or throughputs that are relatively higher than electrical connectors without some or all of the features described herein, by reducing crosstalk, reducing noise persistence, reducing impedance footprint mismatch and/or reducing intra-pair skew, as described in further detail below.

The contact module 160 includes a ground shield 350 that provides shielding for the receptacle signal contacts 162. In an exemplary embodiment, the ground shield 350 is located between pairs of the receptacle signal contacts 162 to provide shielding between each of the pairs of receptacle signal contacts 162.

Figure 6:
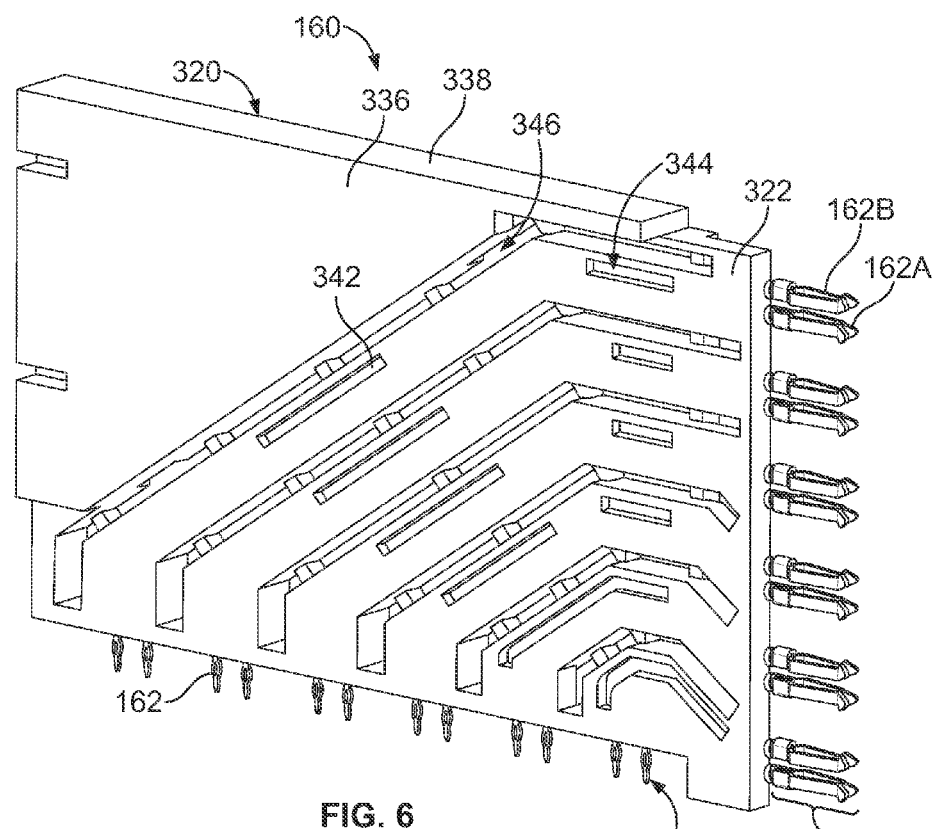
FIG. 6 is a side perspective view of the contact module.
Figure 7:
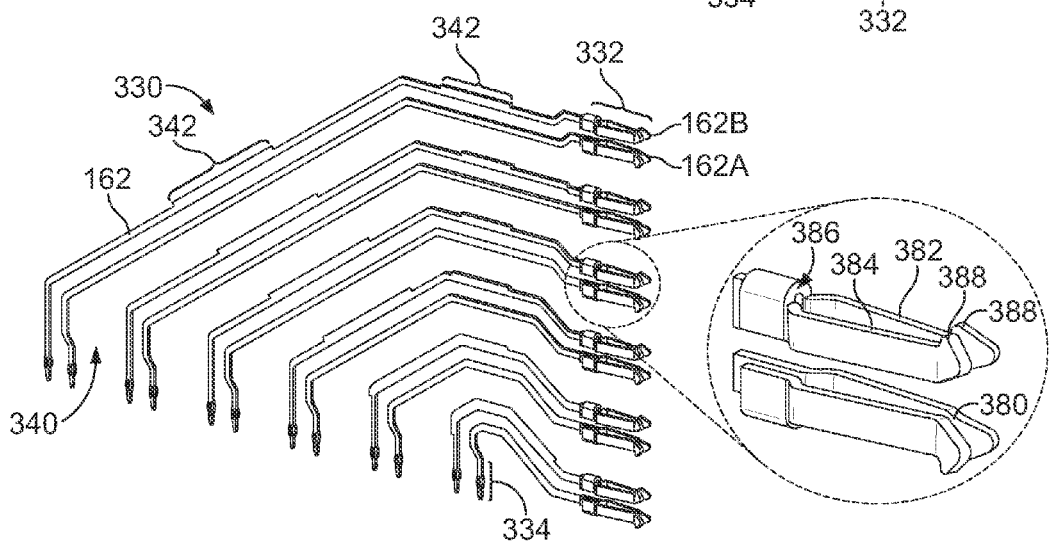
FIG. 7 illustrates a leadframe of the contact module.

FIG. 6 is a side perspective view of the contact module 160 without the ground shield 350 (shown in FIG. 5), showing the frame assembly 320. FIG. 7 illustrates a leadframe 330 of the frame assembly 320 that forms the receptacle signal contacts 162. The leadframe 330 is stamped and formed. The leadframe 330 is initially held together by a carrier (not shown) with connecting portions between each of the conductors.

The leadframe 330 is enclosed within the dielectric frame 322, but is at least partially exposed by dielectric frame 322 in certain areas. In some embodiments, the dielectric frame 322 is manufactured using an over-molding process. During the over-molding process, the leadframe 330 is encased in a dielectric material, which forms the dielectric frame 322. The receptacle signal contacts 162 have mating portions 332 extending from one edge of the dielectric frame 322 (e.g. a front edge), and mounting portions 334 extending from another edge of the dielectric frame 322 (e.g. the bottom edge). The front and bottom edges are generally perpendicular to one another. The mating and mounting portions 332, 334 may extend from other edges or portions of the dielectric frame 322 in alternative embodiments. The dielectric frame 322 includes opposite sides 336, 338 that extend substantially parallel to and along the leadframe 330.

The receptacle signal contacts 162 are arranged in pairs. One of the receptacle signal contacts in each pair defines a radially inner receptacle signal contact 162A, while the other receptacle signal contact in each pair defines a radially outer receptacle signal contact 162B.

As illustrated in FIG. 7, the leadframe 330 is generally planar and defines a leadframe plane. The mating and mounting portions 332, 334 are integrally formed with the conductors of the leadframe 330. The conductors extend along predetermined paths between each mating portion 332 and corresponding mounting portion 334. The mating portions 332 are configured to be mated with and electrically connected to corresponding header signal contacts 120 (shown in FIG. 1). The mounting portions 334 are configured to be electrically connected to the second circuit board 150 (shown in FIG. 4). For example, the mounting portions 334 may include compliant pins that extend into conductive vias in the second circuit board 150.

The mating portions 332 include a plurality of mating interfaces 380 to define multiple points of contact with the header signal contacts 120 (shown in FIG. 2). In the illustrated embodiment, the mating portions 332 define a wishbone type of contact having two, generally parallel mating beams 382, 384. The mating beams 382, 384 are deflectable during mating with the header signal contacts 120. The mating portions 332 have folded over portions 386 with the mating beams 382, 384 on opposite sides of the folded over portions 386. The folded over portions 386 may be U-shaped channels with the mating beams 382, 384 extending forward from the folded over portions 386. Other configurations are possible in alternative embodiments. Optionally, the mating portions 332 may have paddles 388 provided at distal ends of the mating beams 382, 384. The paddles 388 may be used to locate the mating portions 332 within the signal contact openings 300. In the illustrated embodiment, the paddles 388 face in different directions.

The mating portions 332 may be manufactured by stamping and forming the leadframe 330. Optionally, the mating portions 332 may have a different thickness than other portions of the conductors, such as the encased portions and/or the mounting portions 334. For example, the mating portions 332 may be thicker to increase the spring force of the mating beams 382, 384 for mating with the header signal contacts 120, while the mounting portions 334 are thinner to define compliant pins for loading into the conductive vias. Optionally, the mating portions 332 and/or the mounting portions 334 may be plated or coated.

Gaps 340 are defined between each of the receptacle signal contacts 162. The gaps 340 between receptacle signal contacts 162 of different pairs may be relatively larger than the gaps 340 between the receptacle signal contacts 162 within a pair. By providing the gaps 340, as opposed to having ground conductors between the pairs, the noise persistence of the contact module 160 may be reduced as compared to contact modules 160 having ground conductors. The amount of noise persistence (and noise persistence reduction) may be controlled by selecting a size of the gaps 340 and controlling the dielectric therebetween.

Each of the conductors defining receptacle signal contacts 162 has a predetermined length defined between the mating and mounting portions 332, 334. The lengths of each of the conductors are different, due at least in part to the right angle nature of the contact module 160. For example, the radially inner conductors are generally shorter than the radially outer conductors. While the signal conductors within a differential pair have approximately equal lengths, because of factors such as the size constraint of the contact module 160 and the cost or complexity of manufacture, the radially inner receptacle signal contact 162A within each differential pair is generally slightly shorter than the radially outer receptacle signal contact 162B of the same differential pair. Any difference in length may lead to skew problems, as the signals within the differential pair travel along different path lengths.

In an exemplary embodiment, at least some of the conductors include compensation regions 342. For example, the radially outer receptacle signal contact 162B within each differential pair includes compensation regions 342. The compensation regions 342 are defined as having increased widths along portion(s) of the conductor. With reference back to FIG. 6, the compensation regions 342 are at least partially exposed to air through the dielectric frame 322 to provide a different dielectric through which the conductor extends. For example, the dielectric frame 322 includes windows 344 formed in the sides 336, 338 that expose the conductors and/or the compensation regions 342. In an exemplary embodiment, the windows 344 only expose the radially outer receptacle signal contact 162B within each differential pair, such that the radially inner receptacle signal contact 162A remains encased along the corresponding portion of the length thereof. Within each differential pair, the different dielectric (e.g. air for the radially outer receptacle signal contact 162B) allows the differential signal of the radially outer receptacle signal contact 162B to travel at a different rate along the compensation region 342 as compared to the rate of travel of the differential signal of the radially inner receptacle signal contact 162A through another dielectric (e.g. plastic). In alternative embodiments, rather than air, the window 344 may be filled with a different dielectric having different characteristics than the dielectric of the dielectric frame 322 that allows the signal to travel at a faster rate. Additionally, in other alternative embodiments, the radially inner receptacle signal contacts 162A (rather than, or in addition to, the radially outer receptacle signal contacts 162B) may include compensation regions that travel through a dielectric having a different characteristic that slows the travel of the signal therethrough.

The compensation regions 342 generally have a longitudinal axis extending substantially parallel to the length of the receptacle signal contacts 162 extending from the mating portion 332 to the mounting portion 334. In the illustrated embodiment, the compensation regions 342 are generally rectangular extensions extending radially outward from the radially outer receptacle signal contacts 162B. In an exemplary embodiment, the compensations regions 342 extend at least partially into the gaps 340. The number, size and shape of the compensation regions 342 may be selected to substantially reduce skew. For example, by increasing the size or number of compensation regions 342, the skew may be reduced as compared to smaller or less compensation regions 342. Additionally, the increased width in the compensation region 342 controls the impedance, as the impedance changes with the change in dielectric constant.

With reference to FIG. 6, in an exemplary embodiment, the dielectric frame 322 includes a plurality of trenches 346 formed entirely through the dielectric frame 322 between the sides 336, 338. The trenches 346 are aligned with the gaps 340. The trenches 346 are configured to receive portions of the ground shield 350 to provide shielding between certain receptacle signal contacts 162, such as between pairs of receptacle signal contacts 162. The ground shield 350 may provide electrical shielding between and around respective pairs of the receptacle signal contacts 162. The ground shield 350 may control electrical characteristics, such as impedance control, crosstalk control, and the like, of the receptacle signal contacts 162.

With reference back to FIG. 5, the ground shield 350 includes a side shell 352 and one or more ground clips 354, 355 that are coupled to the side shell 352. The side shell 352 has a main body 356 that is generally planar and extends along the first side 336 of the dielectric frame 322. The side shell 352 includes ground tabs 358 extending (e.g. downward) from the main body 356. The ground tabs 358 are configured to be received in corresponding trenches 346 such that the ground tabs 358 are located between adjacent pairs of receptacle signal contacts 162. The ground tabs 358 and side shell 352 together define a C-shaped shield structure that surrounds each pair of receptacle signal contacts 162 on three sides.

The ground clips 354, 355 are mounted to a front of the side shell 352. The ground clips 354, 355 are similar to one another and only the ground clip 354 is described in detail below. The ground clip 354 includes a base 360 and grounding beams 362 extending from a front 364 of the base 360. The grounding beams 362 are configured to extend into the ground contact openings 302 (shown in FIG. 4). The grounding beams 362 are configured to engage and be electrically connected to the header ground shields 122 (shown in FIG. 2) when the contact module 160 is loaded into the front housing 158 and when the second receptacle assembly 152 is coupled to the second header assembly 118. The grounding beams 362 may be deflectable. In the illustrated embodiment, the ground clip 354 includes a central grounding beam 362A and a pair of side grounding beams 362B, 362C. The central grounding beams 362A are configured to be positioned above the pairs of receptacle signal contacts 162. The side grounding beams 362B, 362C are configured to be positioned between pairs of the receptacle signal contacts 162 that are held by the same dielectric frame 322. In an exemplary embodiment, the side grounding beams 362B are positioned at a different vertical position (e.g. lower or further from the base 360) than the other side grounding beams 362C. The side grounding beams 362B, 362C provide shielding along sides of the mating portions 332 of the receptacle signal contacts 162. The grounding beams 362 provide shielding on three sides of each pair of receptacle signal contacts 162.

In an exemplary embodiment, the ground clips 354, 355 are mounted to the side shell 352 such that the grounding beams 362 are interleaved. The grounding beams 162 of each ground clip 354, 355 provide shielding around successive, alternating pairs of receptacle signal contacts 162. In an exemplary embodiment, the ground clips 354, 355 are stamped and formed. The material used to define the grounding beams 362 requires the grounding beams 362 to be spaced apart by a predetermined distance. In order to accommodate the tight pitch of the receptacle signal contacts 162, the two ground clips 354, 355 are utilized so that the grounding beams 362 of the ground clip 354 are spaced out to align with every other pair of receptacle signal contacts 162, while the grounding beams 362 of the ground clip 355 align with the intervening pairs of receptacle signal contacts 162.

The ground shield 350 includes ground pins 366 extending from a bottom 368 of the side shell 352. The ground pins 366 may be compliant pins. The ground pins 366 are configured to be received in corresponding conductive vias in the second circuit board 150. Optionally, the ground pins 366 may be integrally formed with the side shell 352. In an alternative embodiment, a separate clip or bar may be coupled to the bottom 368 of the side shell 352 that includes the ground pins 366.

With reference to FIG. 4, during assembly, the ground clips 354, 355 are coupled to the side shell 352. As noted above, the side grounding beams 362B, 362C of the ground clips 354, 355 are at different vertical positions allowing the side grounding beams 362B to be placed under the side grounding beams 362C for tighter spacing of the grounding beams 362 and/or deflection of the grounding beams 362 during mating with the header ground shields 122 (shown in FIG. 2). The ground shield 350 is coupled to the side 336 of the frame assembly 320. The contact module 160 is then loaded into the rear of the front housing 158. In an exemplary embodiment, the contact modules 160 are oriented horizontally, with the receptacle signal contacts 162 being arranged in pairs, in column and horizontally. Both receptacle signal contacts 162 of the pair are held by the same contact module 160. Once all of the contact modules 160 are loaded into the front housing 158, the first receptacle assembly 152 may be mounted to the second circuit board 150. The receptacle signal contacts 162 are then oriented in-column perpendicular to the second circuit board 150.

Figure 8:
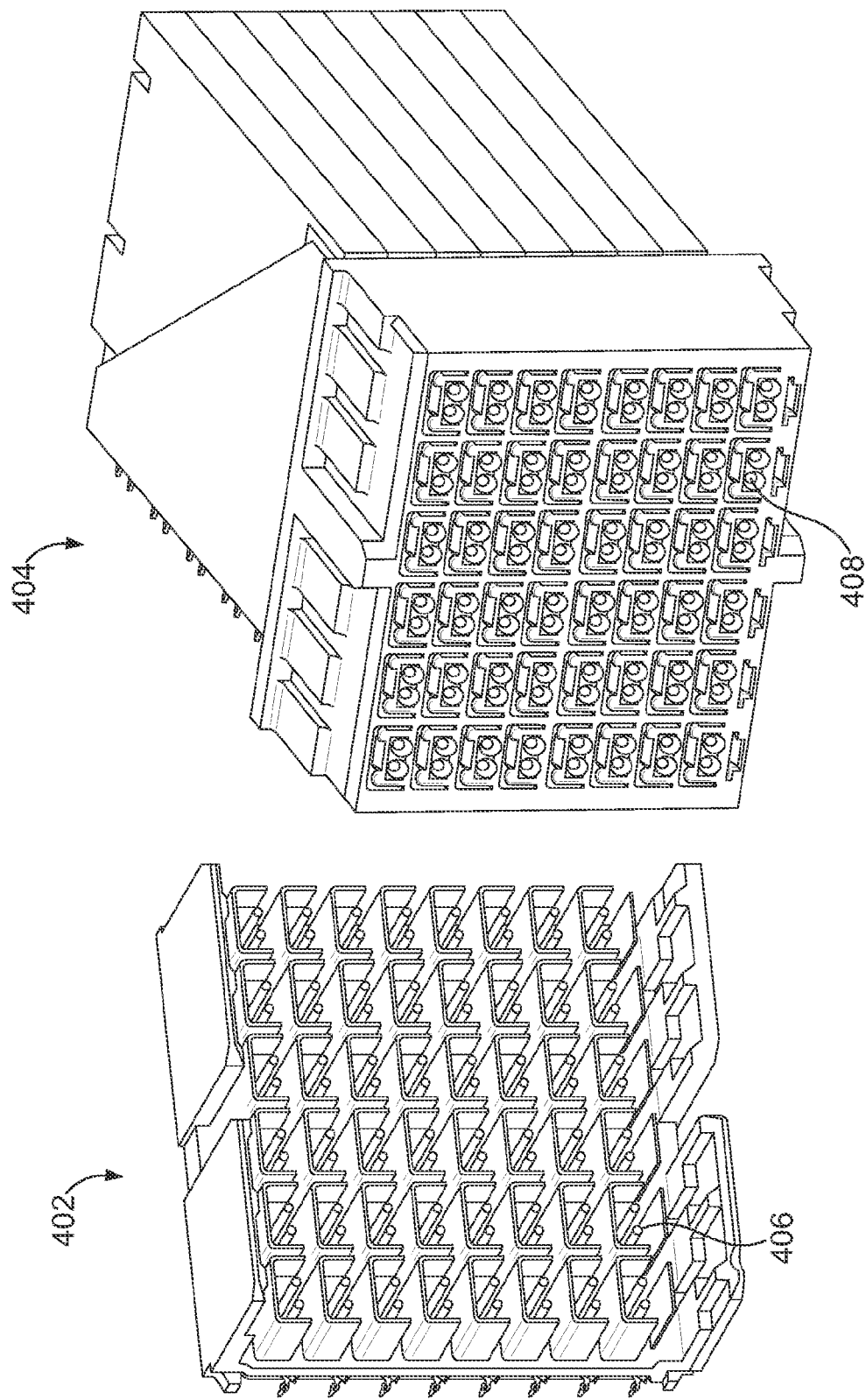
FIG. 8 illustrates a header assembly and receptacle assembly.

FIG. 8 illustrates an alternative header assembly 402 and receptacle assembly 404. The header assembly 402 is similar to the header assembly 118 (shown in FIG. 2), however the header assembly 402 includes header signal contacts 406 that are pins rather than blade type contacts. The pins are round. The pins may be stamped and formed. The receptacle assembly 404 is similar to the receptacle assembly 152 (shown in FIG. 4), however the receptacle assembly 404 includes receptacle signal contacts 408 that are sockets rather than the double blade type of the receptacle assembly 152.

Figure 9:
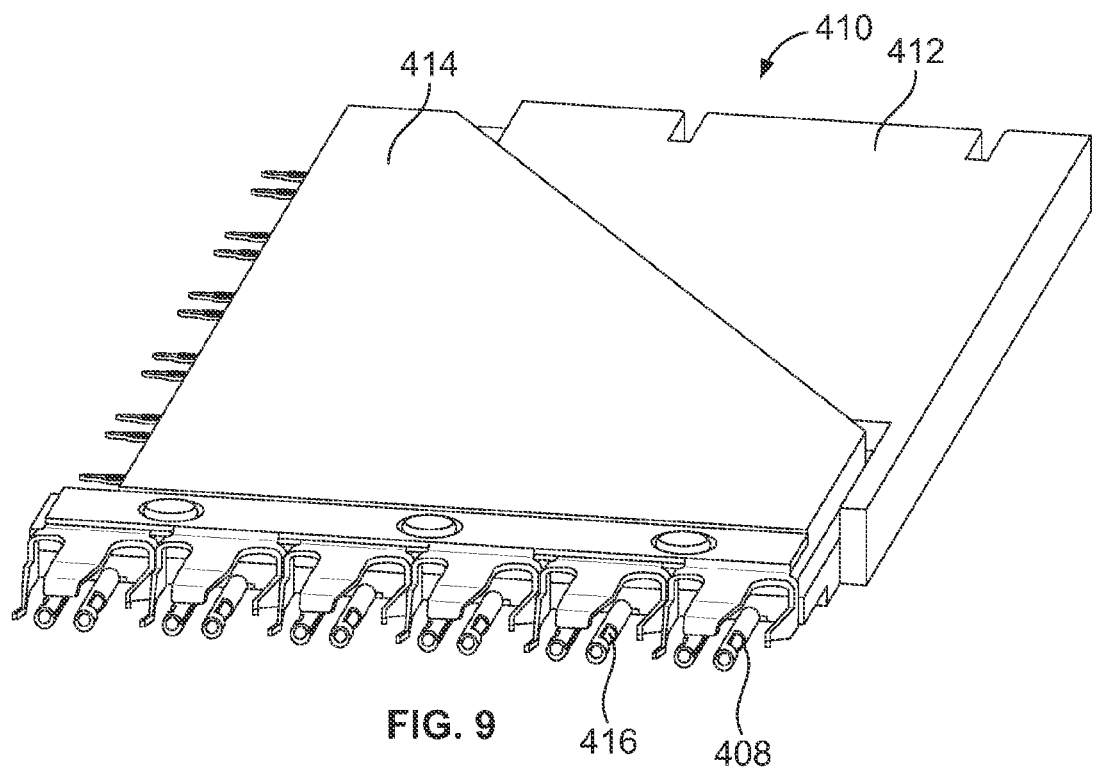
FIG. 9 illustrates a contact module for the receptacle assembly shown in FIG. 8.

FIG. 9 illustrates a contact module 410 for the receptacle assembly 404. The receptacle signal contacts 408 are held by a dielectric frame 412 of the contact module 410. A ground shield 414 provides shielding between pairs of the receptacle signal contacts 408. The receptacle signal contacts 408 include deflectable beams 416 that extend into the sockets to engage the pins of the header assembly 402 when the receptacle assembly 404 is coupled to the header assembly 402. The receptacle signal contact 408 may include a second point of contact, such as at the side of the socket opposite the beam 416 that the pin is driven against by the beam 416. In an exemplary embodiment, the receptacle signal contacts 408 are stamped and formed. The receptacle signal contacts 408 may be part of a leadframe.

Figure 10:
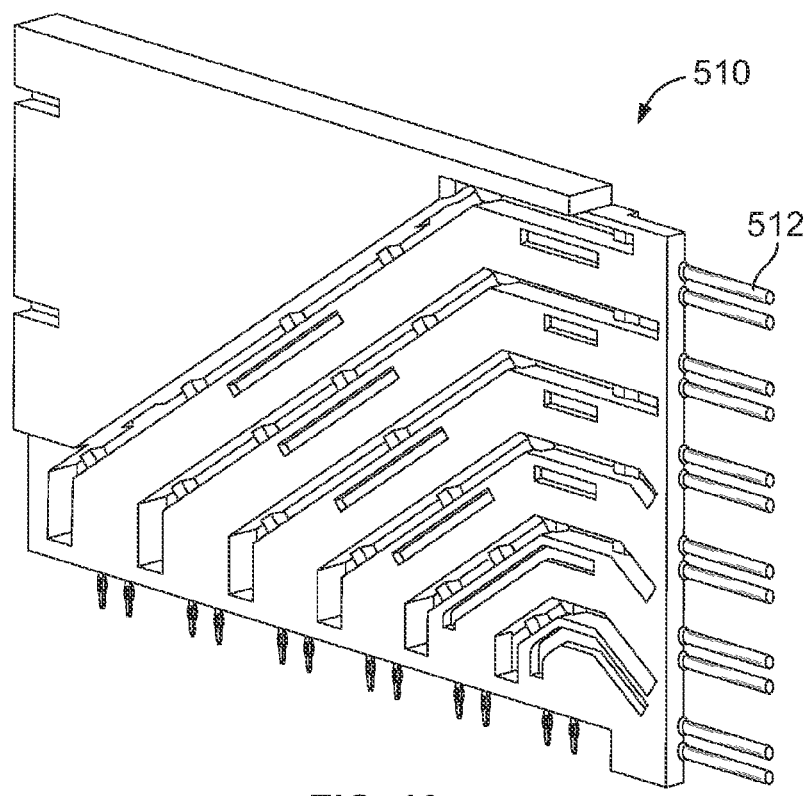
FIG. 10 illustrates a contact module.

FIG. 10 illustrates a contact module 510 that has a reverse sex as compared to the contact module 410. The contact module 510 has receptacle signal contacts 512 that are pins. The receptacle signal contacts 512 are configured to be loaded into sockets held by a header assembly (not shown).

Figure 11:
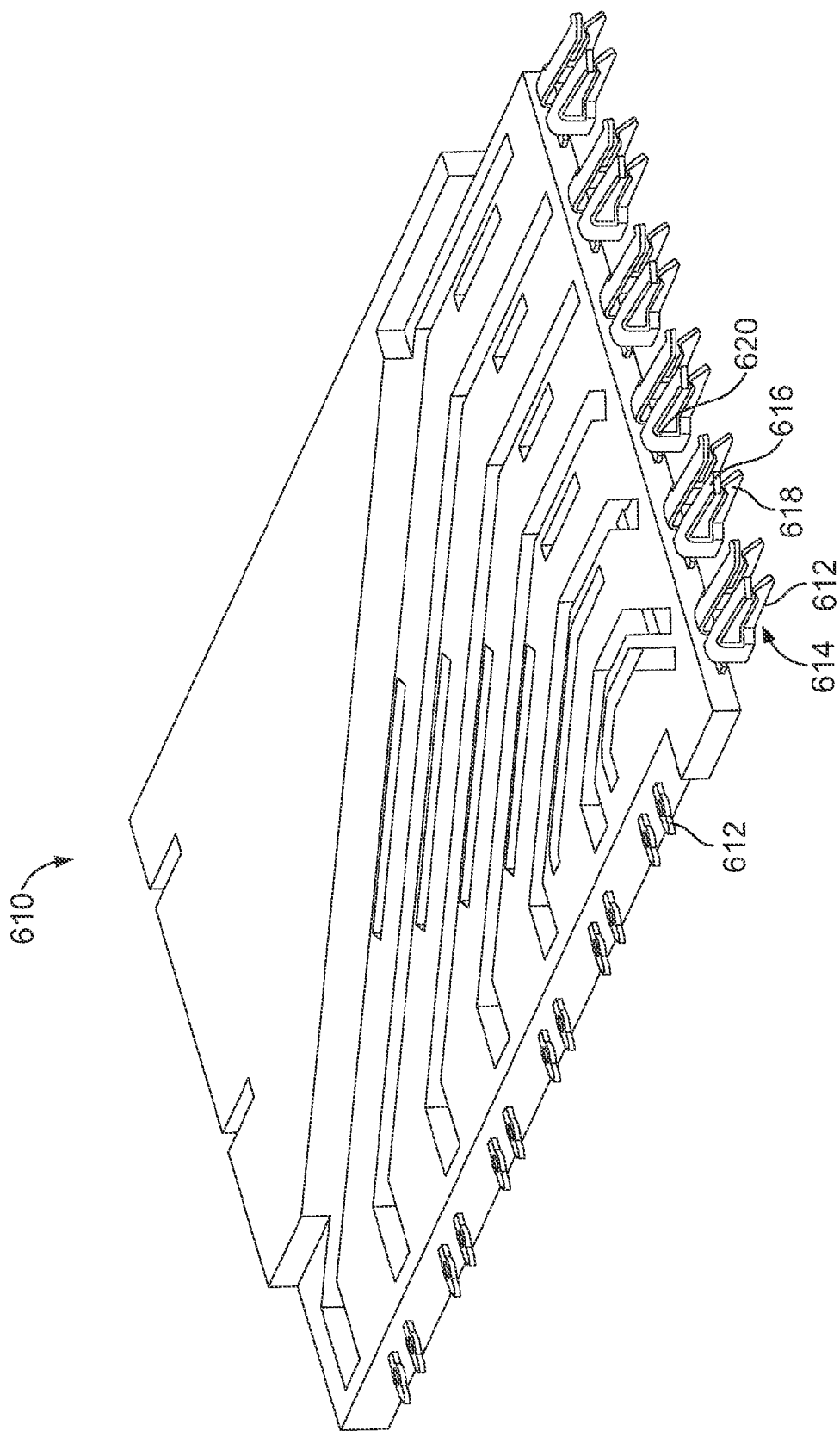
FIG. 11 illustrates a contact module.

FIG. 11 illustrates a contact module 610 that has a different mating interface than the contact module 160. The contact module 610 includes receptacle signal contacts 612 having mating portions 614. The mating portions 614 include a plurality of mating interfaces to define multiple points of contact with the header signal contacts 120 (shown in FIG. 2). In the illustrated embodiment, the mating portions 614 having two mating beams 616, 618 that deflect in opposite directions and that are oriented generally perpendicular with respect to one another. The mating beams 616, 618 are deflectable during mating with the header signal contacts 120.

The mating portions 614 have folded over portions 620 with the mating beams 616, 618 on opposite sides of the folded over portions 620. The folded over portions 620 are generally L-shaped with the mating beams 616, 618 extending forward from the folded over portions 620. The arrangement of the mating beams 616, 618 allows the header signal contacts 120 to extend to and/or beyond the folded over portions 620. The receptacle signal contacts 612 may accommodate longer header signal contacts 120 than the receptacle signal contacts 162 (shown in FIG. 7), which may bottom out at the folded over portions 386 (shown in FIG. 7).

The mating beams 616, 618 oppose one another across a gap that receives the header signal contacts 120. In an exemplary embodiment, a sheared edge of the mating beam 618 engages one side of the header signal contact 120 while a milled edge of the mating beam 616 engages the other side of the header signal contact 120.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A midplane connector system comprising:
a midplane assembly comprising a midplane circuit board having a first side and a second side, the midplane assembly comprising a first header assembly mounted to and extending from the first side of the midplane circuit board and a second header assembly mounted to and extending from the second side of the midplane circuit board, the midplane assembly having a plurality of signal paths each comprising a signal contact of the first header assembly, a conductive via through the midplane circuit board and a signal contact of the second header assembly, each of the signal paths including the signal contacts of the first and second header assemblies being received in the same via;
a first connector assembly having a first circuit board and a first receptacle assembly coupled to the first circuit board, the first receptacle assembly being coupled to the first header assembly, the first receptacle assembly having contact modules having receptacle signal contacts arranged in pairs, the receptacle signal contacts of the first connector assembly having mating portions, the mating portions of pairs of receptacle signal contacts of the first connector assembly being aligned along a first pair plane oriented parallel to the first circuit board, the receptacle signal contacts of the first connector assembly being coupled to corresponding signal contacts of the first header assembly; and
a second connector assembly having a second circuit board and a second receptacle assembly coupled to the second circuit board, the second receptacle assembly being coupled to the second header assembly, the second receptacle assembly having contact modules having receptacle signal contacts arranged in pairs, the receptacle signal contacts of the second connector assembly having mating portions, the mating portions of pairs of receptacle signal contacts of the second connector assembly being aligned along a second pair plane oriented perpendicular to the second circuit board, the receptacle signal contacts of the second connector assembly being coupled to corresponding signal contacts of the second header assembly, the mating portions of receptacle signal contacts of the second connector assembly surrounding corresponding signal contacts of the second header assembly on at least two sides thereof.

2. The connector system of claim 1, wherein the contact modules of the first connector assembly are arranged vertically and the contact modules of the second connector assembly are arranged horizontally.

3. The connector system of claim 1, wherein the contact modules of the first connector assembly are arranged perpendicular with respect to the contact modules of the second connector assembly.

4. The connector system of claim 1, wherein the first and second header assemblies are identical to one another.

5. The connector system of claim 1, wherein the first header assembly includes C-shaped ground shields peripherally surrounding a corresponding pair of signal contacts of the first header assembly on three sides thereof, the ground shields of the first header assembly extending into the first receptacle assembly to peripherally surround a corresponding pair of the receptacle signal contacts of the first receptacle assembly on three sides thereof, and wherein the second header assembly includes C-shaped ground shields peripherally surrounding a corresponding pair of signal contacts of the second header assembly on three sides thereof, the ground shields of the second header assembly extending into the second receptacle assembly to peripherally surround a corresponding pair of the receptacle signal contacts of the second receptacle assembly on three sides thereof.

6. The connector system of claim 1, wherein each contact module holds a plurality of receptacle signal contacts in a column, each pair of receptacle signal contacts of the first receptacle assembly being held in different columns, each pair of receptacle signal contacts of the second receptacle assembly being held in a column in the same contact module.

7. The connector system of claim 1, the contact modules of the second connector assembly each comprising:
a leadframe having the receptacle signal contacts, the receptacle signal contacts being generally arranged along a leadframe plane, the receptacle signal contacts having mating portions at ends thereof, each mating portion having at least two points of contact configured to be electrically connected to a corresponding signal contact of the second header assembly;
a dielectric frame holding the receptacle signal contacts, the dielectric frame having opposite first and second sides which are generally parallel to the leadframe plane; and
a ground shield coupled to the first side of the dielectric frame, the ground shield having ground tabs extending into the dielectric frame, the ground tabs providing electrical shielding between the pairs of receptacle signal contacts, the ground shield having grounding beams which are electrically connected to a corresponding ground shield of the second header assembly.

8. A receptacle assembly comprising:
a receptacle housing having signal contact openings and ground shield openings, the signal contact openings being configured to receive signal contacts of a header assembly therethrough, the ground shield openings being configured to receive ground shields of the header assembly therethrough; and
contact modules coupled to the receptacle housing, the contact modules each comprising:
a leadframe having signal contacts, the signal contacts being arranged in pairs carrying differential signals, the signal contacts being generally arranged along a leadframe plane, the signal contacts having mating portions at ends thereof, each mating portion configured to be electrically connected to a corresponding signal contact of the header assembly;
a dielectric frame holding the signal contacts and having opposite first and second sides which are generally parallel to the leadframe plane; and
a ground shield coupled to the first side of the dielectric frame, the ground shield having ground tabs extending into the dielectric frame, the ground tabs providing electrical shielding between the pairs of signal contacts, the ground shield having deflectable grounding beams configured to resiliently engage a corresponding ground shield of the header assembly to electrically connect the ground shield to the ground shield of the header assembly.

9. The receptacle assembly of claim 8, wherein the ground shield includes a side shell, the ground tabs extending from the side shell to define C-shaped ground channels, each ground channel receiving a corresponding pair of the signal contacts.

10. The receptacle assembly of claim 9, wherein the ground tabs and the side shell provide shielding on three sides of the pair of signal contacts along a majority of a length of the signal contacts.

11. The receptacle assembly of claim 8, wherein the contact modules are held horizontally by the receptacle housing, the ground shield providing shielding vertically above each pair of signal contacts, the ground tabs providing shielding horizontally between each pair of signal contacts.

12. The receptacle assembly of claim 8, wherein each ground shield has open bottomed ground channels that receive corresponding pairs of signal contacts, the ground shield of the contact module below a corresponding pair of signal contacts providing electrical shielding across the open bottom of the corresponding ground channel.

13. The receptacle assembly of claim 8, wherein the dielectric frame includes a plurality of trenches, the trenches extending alongside the pairs of signal contacts, the trenches receiving the ground tabs such that the ground tabs are positioned between corresponding pairs of signal contacts.

14. The receptacle assembly of claim 8, wherein the signal contacts of each pair have different lengths between mating portions and corresponding mounting portions of the signal contacts, the dielectric frame having windows exposing to air segments of the longer of the signal contacts of the pairs to compensate for the extra length.

15. The receptacle assembly of claim 8, wherein the mating portions have folded over portions, the two points of contact being located on opposite sides of the folded over portions.

16. The receptacle assembly of claim 8, wherein the ground shield includes a side shell and a shield clip separately provided from the side shell and coupled to the side shell, the ground tabs extending from the side shell, the grounding beams extending from the shield clip, the grounding beams being arranged on three sides of the mating portions of the pair of signal contacts, the side shell and grounding tabs being arranged on three sides of the pair of signal contacts.

17. A contact module for a receptacle assembly, the contact module comprising:

a leadframe having signal contacts, the signal contacts being arranged in pairs carrying differential signals, the signal contacts being generally arranged along a leadframe plane, the signal contacts having mating portions at ends thereof;

a dielectric frame holding the signal contacts, the dielectric frame having opposite first and second sides which are generally parallel to the leadframe plane; and a ground shield coupled to the first side of the dielectric frame, the ground shield comprising a side shell and first and second shield clips, the side shell having ground tabs extending into the dielectric frame, the ground tabs providing electrical shielding between the pairs of signal contacts, the first and second shield clips being coupled to the side shell, the first and second shield clips having deflectable grounding beams being arranged on three sides of the mating portions of the corresponding pair of signal contacts, the grounding beams of the first and second shield clips being interleaved around successive, alternating pairs of receptacle signal contacts.

18. The contact module of claim 17, wherein the ground tabs extending from the side shell to define C-shaped ground channels, each ground channel receiving a corresponding pair of the signal contacts.

19. The contact module of claim 17, wherein the dielectric frame includes a plurality of trenches, the trenches extending alongside the pairs of signal contacts, the trenches receiving the ground tabs such that the ground tabs are positioned between corresponding pairs of signal contacts.

20. The contact module of claim 17, wherein the grounding beams are configured to resiliently engage a corresponding ground shield of the header assembly to maintain an electrical connection with the ground shield of the header assembly.

\* \* \* \* \*